(12) United States Patent
Lin et al.

(10) Patent No.: US 8,999,508 B2
(45) Date of Patent: Apr. 7, 2015

(54) BACK SHEET OF SOLAR CELL AND MANUFACTURING METHOD THEREOF

(75) Inventors: Jianwei Lin, Changshu (CN); Zhihuang Fei, Changshu (CN); Yuzheng Zhang, Changshu (CN)

(73) Assignee: Jolywood (Suzhou) Sunwatt Co. Ltd, Changshu (CN)

( * ) Notice: Subject to any disclaimer, the term of this patent is extended or adjusted under 35 U.S.C. 154(b) by 440 days.

(21) Appl. No.: 13/059,520

(22) PCT Filed: Aug. 21, 2009

(86) PCT No.: PCT/CN2009/000965
§ 371 (c)(1),
(2), (4) Date: Feb. 17, 2011

(87) PCT Pub. No.: WO2010/022585
PCT Pub. Date: Mar. 4, 2010

(65) Prior Publication Data
US 2011/0132454 A1   Jun. 9, 2011

(30) Foreign Application Priority Data

Aug. 29, 2008  (CN) .......................... 2008 1 0210177
Aug. 21, 2009  (CN) ................. PCT/CN2009/000965

(51) Int. Cl.
| H01L 31/0216 | (2014.01) |
| H01L 31/18 | (2006.01) |
| B32B 38/00 | (2006.01) |
| H01L 31/048 | (2014.01) |
| B32B 5/18 | (2006.01) |
| B32B 7/12 | (2006.01) |
| B32B 27/08 | (2006.01) |
| B32B 27/30 | (2006.01) |
| B32B 27/32 | (2006.01) |
| B32B 27/36 | (2006.01) |
| C08J 7/04 | (2006.01) |

(52) U.S. Cl.
CPC .............. *H01L 31/048* (2013.01); *B32B 5/18* (2013.01); *B32B 7/12* (2013.01); *B32B 27/08* (2013.01); *B32B 27/30* (2013.01); *B32B 27/32* (2013.01); *B32B 27/36* (2013.01); *C08J 7/045* (2013.01); *B32B 2307/714* (2013.01); *B32B 2307/7242* (2013.01); *B32B 2309/025* (2013.01); *B32B 2309/105* (2013.01); *B32B 2310/0875* (2013.01); *B32B 2327/12* (2013.01); *B32B 2331/04* (2013.01); *B32B 2367/00* (2013.01); *B32B 2457/12* (2013.01); *C08J 2367/02* (2013.01); *Y02E 10/50* (2013.01)

(58) Field of Classification Search
None
See application file for complete search history.

(56) References Cited

U.S. PATENT DOCUMENTS

| 5,800,631 | A  | * | 9/1998 | Yamada et al. ................ 136/251 |
| 6,340,711 | B1 | * | 1/2002 | Ohmori et al. ................... 516/79 |
| 2006/0166023 | A1 | * | 7/2006 | Yoshikata et al. ............. 428/523 |
| 2007/0154704 | A1 | * | 7/2007 | Debergalis et al. ........... 428/323 |
| 2008/0053512 | A1 | * | 3/2008 | Kawashima ................... 136/244 |

FOREIGN PATENT DOCUMENTS

| CN | 10112396 A | 2/2008 |
| CN | 101123296 A | 2/2008 |
| CN | 101177514 A | 5/2008 |
| CN | 201199525 Y | 2/2009 |
| CN | 201199526 Y | 2/2009 |
| EP | 1938967 A1 * | 7/2008 |
| JP | 7176775 A | 7/1995 |
| JP | 2004214342 A | 7/2004 |
| WO | WO 0196107 A2 * | 12/2001 |
| WO | 2007/010706 A1 | 1/2007 |

OTHER PUBLICATIONS

International Search Report (with English translation) from counterpart PCT Application No. PCT/CN2009/000965 mailed Dec. 3, 2009 (8 pages).

* cited by examiner

*Primary Examiner* — Callie Shosho
*Assistant Examiner* — Patrick English
(74) *Attorney, Agent, or Firm* — Wood, Herron & Evans, LLP

(57) ABSTRACT

A back sheet of solar module with high adhesivity comprises a substrate (3), a layer of fluorine-based film (2), and a layer of fluoro-silicone film (1) or titanium-silicon film (4) formed between the layer of fluorine-based film (2) and the substrate (3), as well as on outer surface of the layer of fluorine-based film (2). A method for manufacturing the back sheet of solar module comprises the treatment on the layer of fluorine-based film (2) and/or substrate (3) with compound of fluoro-silicone or titanium-silicon, so as to coat a layer of fluoro-silicone film (1) or titanium-silicon film (4).

19 Claims, 2 Drawing Sheets

BACK SHEET OF SOLAR CELL AND MANUFACTURING METHOD THEREOF

FIELD OF THE INVENTION

This invention relates to a module of solar module, particularly to a back sheet of solar module with high adhesivity, and also relates to a manufacturing method of the back sheet.

BACKGROUND OF THE INVENTION

A solar panel is usually a laminated structure which includes a glass surface, an EVA sealing layer, solar modules, an EVA sealing layer and the solar module back sheet, wherein the solar modules are packed between the two layers of sealing EVA. The back sheet of solar modules is mainly to improve the overall mechanical strength and prevent moisture penetration into the sealing layer which will impact service life of the battery slice. In prior art, many improvement technologies have been studied in order to improve the overall performance of the back sheet. For example, a Chinese invention patent application, with Appl. No. CN200710185202.8, publication date: May 14, 2008, Publication No. CN101177514, discloses a back sheet of solar modules and a manufacturing method thereof, which comprises a substrate and a fluorinated polymer layer, components of the fluorinated polymer layer calculated by mass are as follows: 25 to 45 parts of fluorinated resin; 1.5 to 3 parts of modified resin were; 0.5 to 3 parts of polymer filler; 0.1 to 1 part of inorganic filler; 50 to 70 parts of solvent. The advantages of this scheme are low production cost, excellent performance, good peeling strength, water resistance and good weather resistance. In addition, an European patent application, with appl. no. EP1938967, publication date of Jul. 2, 2008, international appl. no. PCT/JP2006/312501, international publication no. WO2007/010706, and international publication date of Jan. 25, 2007, discloses an impermeable back sheet of solar modules which at least has one side of waterproof board with cured coating film which comprises a fluorine polymer coating with functional groups curability. The above mentioned solution provides a method of preparing the fluoro polymer coatings which can be coated on a substrate, in order to improve the overall performance of the back sheet, but due to the disadvantage of Fluoride materials thereof, such as the high surface energy, surface hydrophobicity and poor adhesion properties, which reduces the binding property between the back sheet and EVA, and it also makes the adhesive process more complex.

SUMMARY OF THE INVENTION

The present invention is directed to solving problems existing in the prior art, accordingly, provides a back sheet of solar module with high adhesive property, better weathering performance, high chemical resistance, good electrical insulation properties and high water resistance.

Another purpose of the present invention is to solve the problems existing in the prior art by providing a method for manufacturing the back sheet of solar module with high adhesive property.

According to the present invention, there is provided a back sheet of solar module with high adhesivity which comprises a substrate, a layer of fluorine-based film and a layer of fluoro-silicone film or titanium-silicon film formed between said layer of fluorine-based film and said substrate.

A thickness of the layer of fluoro-silicone film or titanium-silicon film is 0.01 to 5 μm.

The substrate is a substrate of PET.

The substrate is a substrate of polymer alloy made by melt blending of PET with PBT or PET with PEN, a content of the PBT or PEN is 1-50 parts by mass.

The substrate is formed by adding inorganic oxide to PET, the inorganic oxide selected from $SiO_2$, $TiO_2$, $Al_2O_3$ or $ZrO_2$, a content of the inorganic oxide is 1-35 parts by mass.

The substrate is a fine closed-module foam layer.

A thickness of the substrate is 0.1 to 10 mm.

The layer of fluorine-based film is tetrafluoroethylene, ternary copolymer or is chlorotrifluoroethylene, the ternary copolymer formed by $C_2F_4$, $C_3F_6$ and PVDF.

A content of fluor resin in the layer of fluorine-based film is 30-95 parts by mass.

The layer of fluoro-silicone film formed on surface of the substrate or layer of fluorine-based by treatment of plasma-fluoro-silicone.

The layer of titanium-silicon film formed on surface of the substrate or layer of fluorine-based film by treatment of plasma-titanium-silicon.

According to the present invention, there is provided a method for manufacturing a back sheet of solar module with high adhesivity, comprising:
(1) activating a surface of a substrate by treatment of plasma;
(2) forming a layer of fluoro-silicone film or titanium-silicon film on the surface of the activated substrate by spraying, roll coating or immersing with compound of fluoro-silicone or titanium-silicon, and then heating 1-600 seconds at 20-200° C.;
(3) heating the substrate having layer of fluoro-silicone film or titanium-silicon film to 50-200° C., then double or single-sided coating with layer of fluorine-based film, so as to form a base, a thickness of the layer of fluorine-based film is 5-200 μm;
(4) activating the surface of the base by treatment of plasma;
(5) forming the layer of fluoro-silicone film or titanium-silicon film on the surface of the activated base by spraying, roll coating or immersing with compound of fluoro-silicone or titanium-silicon, and then heating 1-600 seconds at 20-200° C.

According to the present invention, there is provided a further method for manufacturing a back sheet of solar module with high adhesivity, comprising:
(1) activating two surfaces of a layer of fluorine-based film by treatment of plasma:
(2) forming a layer of fluoro-silicone film or titanium-silicon film on the two surfaces of said activated layer of fluorine-based film by spraying, roll coating or immersing with compound of fluoro-silicone or titanium-silicon, and then heating 1-600 seconds at 20-200° C.;
(3) heating said substrate to 50-200° C., then double or single-sided coating with said layer of fluorine-based film having said layer of fluoro-silicone film or titanium-silicon film.

Comparing to the prior art, the solar module back sheet of the present invention with high adhesivity has the following advantages: first, the layer of fluorine-based film and/or the substrate are processed with the treatment of fluoro-silicone or titanium-silicon, in order to form the layer of fluoro-silicone or titanium-silicon film, therefore the present invention obtains better adhesivity, inter-layer density, and barrier properties, especially obtains better barrier against water vapor, moisture-proof performance, electrical performance and better weather resistance; secondly, there's no difference between two surfaces of the back sheet after the above treatment, so as to adapt to a variety of requirements of adhesives, and it's also convenient to use without identifying obverse side or reverse side of the back sheet during coating procedure of solar modules.

The method of manufacturing the back sheet of solar module with high adhesivity has the following advantages: back sheet made by this process has better adhesivity and inter-layer density, better barrier properties and it also enhance production efficiency by achieving continuous production.

DETAILED DESCRIPTION OF PREFERRED EMBODIMENTS

In prior art, it was usual to coat Tendlar film produced by Dupont on both sides of PET's substrate, and the Tendlar film is formed by casting technology and then by treatment of stretching. This film is formed by non-thermal melt, which causes gaps between swelling particles, therefore, the film has low mechanical strength. Moreover, the film is bound with PET substrate by solvent adhesive so that the manufacturing is complex and results in incomplete volatilization of solvent, therefore it's easy to form the weak point of composite films, which means vapor permeability can be highly reached to 4.2 g/m$^2$·d, and will reduce photoelectric conversion of solar modules and shorten working life of solar modules.

Figure 1:
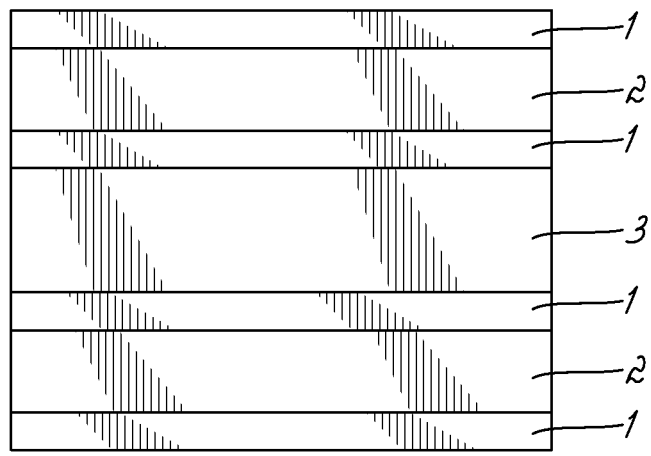
FIG. 1 is a schematic structure diagram of the first preferred embodiment of the present invention.

A back sheet of solar module with high adhesivity of the first embodiment as shown in FIG. 1 includes a substrate 3, a layer of fluorine-based film 2 and a layer of fluoro-silicone film 1. The layer of fluoro-silicone film 1 is formed between the substrate 3 and the layer of fluorine-based film 2 and on an outer surface of the layer of fluorine-based film 2. This structure not only enhances the bond strength between the substrate 3 and the layer of fluorine-based film 2, but it also makes the back sheet of the present invention easily to be bound with solar module. In this embodiment, it includes two layers of fluorine-based film 2 which are respectively formed on two sides of the substrate 3, hence, the back sheet totally includes seven layers, namely: layer of fluoro-silicone film 1, layer of fluorine-based film 2, layer of fluoro-silicone film 1, substrate 3, layer of fluoro-silicone film 1, layer of fluorine-based film 2 and layer of fluoro-silicone film 1. There is no need for identifying obverse side or reverse side of the back sheet during coating procedure of solar modules due to these structure of seven layers. In addition, it also provides better performance in barrier ability, overall moisture resistance, electrical properties and weather resistance.

Actually it can also be a structure of four layers, namely it includes layer of fluoro-silicone film, layer of fluorine-based film, layer of fluoro-silicone film and substrate which are coated with each other in order, however it is necessary to identify obverse side or reverse side of back sheet in practice.

Figure 2:
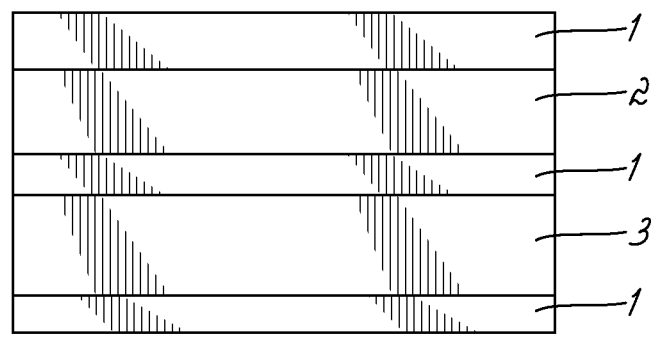
FIG. 2 is a schematic structure diagram of the second preferred embodiment of the present invention.

A back sheet of solar module of the second embodiment as shown in FIG. 2 has a structure of five layers. The back sheet includes layer of fluoro-silicone film 1, layer of fluorine-based film 2, layer of fluoro-silicone film 1, substrate 3 and layer of fluoro-silicone film 1 which are coated with each other in order.

In the above mentioned embodiments, the thickness of the layer of fluoro-silicone film 1 is 0.01 to 5 μm, preferred 0.1 to 2 μm. Depending on the thickness of the substrate 3 and a layer of fluorine-based film 2, the thickness of the layer of fluoro-silicone film 1 is adapted to be 0.05 μm, 0.1 μm, 0.3 μm, 0.8 μm, 1.2 μm, 1.8 μm, 2 μm, 2.5 μm or 3 μm etc. Choice of the thickness is is adapted to meet binding demand of inter-layer and also should enhance overall performance of back sheet.

The substrate 3 of the present invention is adapted to be a substrate of PET, wherein the PET is Polyethylene terephthalate.

The substrate 3 is also adapted to be a substrate of polymer alloy made by melt blending of PET with PBT, wherein the PBT is polybutylene terephthalate, so as to enhance overall performance of the substrate by adding PBT which is adapted to modify PET. A content of PBT is 1-50 parts by mass, preferred 8-20 parts. More specifically, the content of PBT is 1, 4, 8, 12, 15, 18, 20, 25, 30, 40 or 50 parts by mass.

The substrate 3 is also adapted to be a substrate of polymer alloy made by melt blending of PET with PEN, wherein the PEN is Polyethylene glycol naphthalate, so as to enhance overall performance of the substrate by adding PEN which is adapted to modify PET. A content of PEN is 1-50 parts by mass, preferred 8-20 parts. More specifically, the content of PEN is 1, 4, 8, 12, 15, 18, 20, 25, 30, 40 or 50 parts by mass.

After the alloying of PET and PBT or PET and PEN, the substrate 3 has better crystalline, processability and smoothness, so as to improve plasma uniformity of the surface of the substrate 3, and make active groups scattered evenly, which provides a reliable guarantee for coating of the fluoro-silicone film and titanium-silicon (described hereinafter) on large areas with uniformity and stability.

The substrate 3 is formed by adding inorganic oxides to PET. A content of inorganic oxide is 1-35 parts by mass, preferred 10-20 parts. More specifically, the content of inorganic oxide is 1, 5, 10, 12, 16, 20, 25, 30 or 35. Wherein the inorganic oxide is $SiO_2$, $TiO_2$, $Al2O_3$ or $ZrO_2$.

The substrate 3 is also adapted to be PET, and by a process of closed-module foam which forms a fine closed-module foam layer wherein foaming holes have closed and ultra fine structures. These structures have advantages of good supporting capacity, light weight and easy bending, so as to be applied into bendable type solar panels.

The thickness of the substrate 3 is 0.1 mm to 10 mm, wherein a thickness of non-foam layer is 0.2 mm to 0.3 mm, preferred is 0.2 mm, 0.22 mm, 0.25 mm, 0.28 mm or 0.3 mm. The thickness of the foam layer is 1 to 3 mm, preferred is 1 mm, 2 mm or 3 mm.

In the above mentioned embodiments, the layer of fluorine-based film 2 is tetrafluoroethylene film which is adapted to select FFC film produced by JOLYWOOD or to be TFE homopolymer film The layer of fluorine-based film 2 of the present invention is also adapted to be ternary copolymer which is formed by $C_2F_4$, $C_3F_6$ and polyvinylidene fluoride (PVDF), namely THV film.

The layer of fluorine-based film 2 of the present invention is also adapted to be chlorotrifluoroethylene film.

The layer of fluorine-based 2 includes fluor resin with a content of 30-95 parts by mass, preferred 50-80 parts, and more specifically it is 30, 40, 50, 60, 70, 80 or 95 parts.

In the above mentioned embodiments, the layer of fluoro-silicone film 1 is formed on surface of the substrate 3 and/or layer of fluorine-based film 2 by a treatment of plasma-fluoro-silicone.

The present invention provides a method for manufacturing the back sheet of solar module with high adhesivity, the method comprises the following steps:

(1) activating a surface of the substrate 3 by treatment of plasma which can be accomplished by techniques common in the field.

(2) forming the layer of fluoro-silicone film 1 on the surface of the activated substrate 3 by spraying with compound of fluoro-silicone, and then heating 20 seconds at 100° C. In addition, the compound of fluoro-silicone is also adapted to be coated on the surfaces of the substrate 3 by roll coating or immersing.

(3) heating the substrate 3 having the layer of fluoro-silicone film to 90° C., and then double-sided coating with the layer of fluorine-based film, so as to form a base, a thickness of the layer of fluorine-based film is 20 μm. A single-sided coating can also be used in this step.

(4) activating the surface of the base having the layer of fluorine-based film by treatment of plasma. The treatment of plasma can be selected to be the same as the treatment in step 1.

(5) forming the layer of fluoro-silicone film on the surface of the activated base by spraying with compound of fluoro-silicone, and then heating 20 seconds at 100° C. In addition, the compound of fluoro-silicone is also adapted to be coated on the surface of the base by roll coating or immersing.

A chemical formula of the compound of fluoro-silicone is: $Rf-Si(OR)_3$, the products of this compound can be purchased in the market. This compound of fluoro-silicone is organic compound and is adapted in condition of solid or liquid, which can be matched with other liquid. The features of the compound make one end thereof organophilic and the other end thereof inorganophilic, thus effectively improving the adhesion between the layers.

The back sheet prepared by the above mentioned procedures can be sold as finished product which is adapted to be applied in solar module panel and bound with other components in the solar module panel.

In Step 2 and Step 5, the heating temperature is adapted to be 20 to 200° C. and remain 1 to 600 seconds, preferred is 80 to 130° C. and 10 to 60 seconds. Wherein the temperature and time can be adjusted following with different material of each layer. In addition, higher heating temperature, shorter heating time. More specifically, the temperature is 20° C. then it is 600 seconds, the temperature is 40° C. then it is 300 seconds, the temperature is 60° C. then it is 100 seconds, the temperature is 80° C. then it is 40 seconds, the temperature is 120° C. then it is 15 seconds, the temperature is 150° C. then it is 10 seconds, the temperature is 200° C. then it is 1 second.

In Step 3, the heating temperature for the substrate can be reached to 50 to 200° C., preferred is 80 to 150° C., and more specifically is 50° C., 60° C., 80° C., 100° C., 120° C., 150° C., 180° C. or 200° C. While the thickness of layer of fluorine-based film is 5 to 200 μm, preferred is 10-40 μm, more specifically is 5 μm, 10 μm, 15 μm, 25 μm, 35 μm, 40 μm, 60 μm, 100 μm, 150 μm or 200 μm.

The present invention further provides a method for manufacturing the back sheet of solar module with high adhesivity, the method comprises the following steps:

(1) activating two surfaces of the layer of fluorine-based film 2 by treatment of plasma which can be accomplished by techniques common in the is field.

(2) forming a layer of fluoro-silicone film 1 on the two surfaces of the activated layer of fluorine-based film 2 by spraying with compound of fluoro-silicone, and then heating 20 seconds at 100° C. In addition, the compound of fluoro-silicone is also adapted to be coated on the surfaces of the layer of fluorine-based film 2 by roll coating or immersing.

(3) heating the substrate 3 to 90° C., then double-sided coating with the layer of fluorine-based film 2 having the layer of fluoro-silicone film 1. A single-sided coating can also be used in this step In Step 2, heating temperature can be 20 to 200° C. and remain 1 to 600 seconds, preferred the temperature is 80 to 130° C. and remain 10 to 60 seconds. Wherein the temperature and time can be adjusted following with different material of each layer. In addition, higher heating temperature, shorter heating time. More specifically: the temperature is 20° C. then it is 600 seconds, the temperature is 40° C. then it is 300 seconds, the temperature is 60° C. then it is 100 seconds, the temperature is 80° C. then it is 40 seconds, the temperature is 120° C. then it is 15 seconds, the temperature is 150° C. then it is 10 seconds, the temperature is 200° C. then it is 1 second.

In Step 3, the heating temperature for the substrate can be reached to 50 to 200° C., preferred is 80 to 150° C., and more specifically is 50° C., 60° C., 80° C., 100° C., 120° C., 150° C., 180° C. or 200° C. While the thickness of layer of fluorine-based film is 5 to 200 μm, preferred is 10-40 μm, more specifically is 5 μm, 10 μm, 15 μm, 25 μm, 35 μm, 40 μm, 60 μm, 100 μm, 150 μm or 200 μm.

Figure 3:
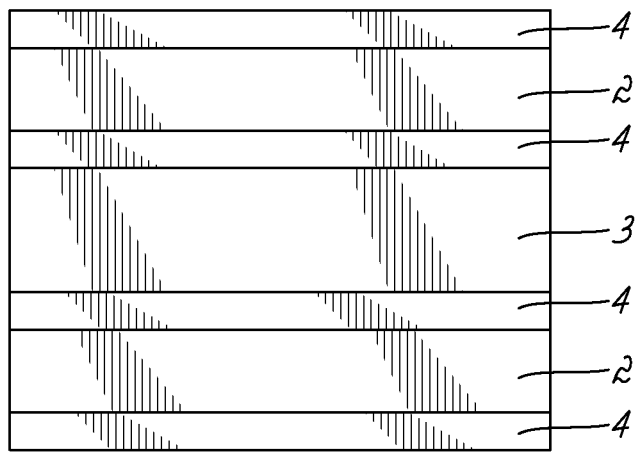
FIG. 3 is a schematic structure diagram of the third preferred embodiment of the present invention.

A back sheet of solar module with high adhesivity of the third embodiment as shown in FIG. 3 includes substrate 3, layer of fluorine-based film 2 and layer of titanium-silicon film 4 which is formed between the substrate 3 and the layer of fluorine-based film 2 and on an outer surface of the layer of fluorine-based film 2. This structure not only enhances the bond strength between the substrate 3 and the layer of fluorine-based film 2, but it also makes the back sheet of the present invention easily bind with solar module. In this embodiment, it includes two layers of fluorine-based film 2 which are respectively formed on two sides of the substrate 3, hence, the back sheet includes seven layers totally, namely layer of titanium-silicon film 4, layer of fluorine-based film 2, layer of titanium-silicon film 4, substrate 3, layer of titanium-silicon film 4, layer of fluorine-based film 2 and layer of titanium-silicon film 4. There is no need for identifying obverse side or reverse side of the back sheet during coating procedure of solar modules due to this structure of seven layers. In addition, it also provides better performances in barrier ability, overall moisture resistance, electrical properties and weather resistance.

Actually it can also be a structure of four layers, namely it includes layer of titanium-silicon film, layer of fluorine-based film, layer of titanium-silicon film and substrate which are coated with each other in order, however it is necessary to identify obverse side or reverse side of back sheet in practice.

Figure 4:
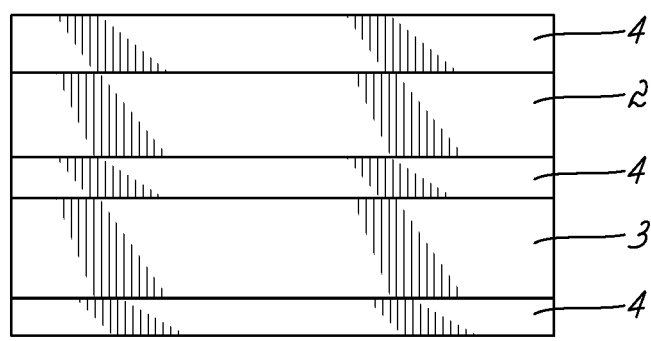
FIG. 4 is a schematic structure diagram of the fourth preferred embodiment of the present invention.

A back sheet of solar module of the fourth embodiment as shown in FIG. 4 has a structure of five layers. The back sheet includes layer of titanium-silicon film 4, layer of fluorine-based film 2, layer of titanium-silicon film 4, substrate 3 and layer of titanium-silicon film 4 which are coated with each other in order.

In the above mentioned embodiments, the thickness of the layer of titanium-silicon film 4 is 0.01 to 5 μm, preferred 0.1 to 2 μm. Depending on the is thickness of the substrate 3 and a layer of fluorine-based film 2, the thickness of the layer of titanium-silicon film 4 is adapted to be 0.05 μm, 0.1 μm, 0.3

μm, 0.8 μm, 1.2 μm, 1.8 μm, 2 μm, 2.5 μm or 3 μm etc. Choice of the thickness is adapted to meet binding demand of interlayer and also should enhance overall performance of back sheet.

The substrate 3 and the layer of fluorine-based film 2 in the present embodiments are same with those described in previous embodiments, therefore, it is not repeatedly described herein.

In the above mentioned embodiments, the layer of titanium-silicon film 4 is formed on surface of the substrate 3 and/or layer of fluorine-based film 2 by a treatment of plasma-titanium-silicon.

A method for manufacturing the back sheet of solar module in accordance with the above mentioned embodiments comprises the following steps:

(1) activating a surface of the substrate 3 by treatment of plasma which can be accomplished by techniques common in the field.

(2) forming the layer of titanium-silicon film 4 on the surface of the activated substrate 3 by spraying with compound of titanium-silicon, and then heating 18 seconds at 110° C. In addition, the compound of titanium-silicon is also adapted to be coated on the surfaces of the substrate 3 by roll coating or immersing.

(3) heating the substrate 3 having the layer of titanium-silicon film to 90° C., and then double-sided coating with the layer of fluorine-based film, so as to form a base, a thickness of the layer of fluorine-based film is 20 μm. A single-sided coating can also be used in this step.

(4) activating the surface of the base having the layer of is fluorine-based film by treatment of plasma. The treatment of plasma can be selected to be the same as the treatment in step 1.

(5) forming the layer of titanium-silicon film on the surface of the activated base by spraying with compound of titanium-silicon, and then heating 18 seconds at 110° C. In addition, the compound of titanium-silicon is also adapted to be coated on the surface of the base by roll coating or immersing.

Another method for manufacturing the back sheet of solar module in accordance with the above mentioned embodiments comprises the following steps:

(1) activating two surfaces of the layer of fluorine-based film 2 by treatment of plasma which can be accomplished by techniques common in the field.

(2) forming a layer of titanium-silicon film 4 on the two surfaces of the activated layer of fluorine-based film 2 by spraying with compound of titanium-silicon, and then heating 18 seconds at 110° C. In addition, the compound of titanium-silicon is also adapted to be coated on the surfaces of the layer of fluorine-based film 2 by roll coating or immersing.

(3) heating the substrate 3 to 90° C., then double-sided coating with the layer of fluorine-based film 2 having the layer of titanium-silicon film 4. A single-sided coating can also be used in this step.

A chemical formula of the compound of titanium-silicon is: $SiO_x$, $TiO_2$, the product of this compound can be purchased in market. This compound of titanium-silicon is organic compound and is adapted in condition of solid or liquid, which can be matched with other liquid. The features of the compound make one end thereof organophilic and the other end thereof inorganophilic, is thus effectively improving the adhesion between the layers.

The method for manufacturing the back sheet of solar module enhances production efficiency by achieving continuous production.

Parameters of product of the present invention are as follows if comparing with other similar products:

| Feature | unit | Japan | USA | Present Invention |
|---|---|---|---|---|
| surface tension | mN/cm | 30-40 | 40 | ≥45 |
| adhesiveness with EVA | N/10 mm | 20-40 | 20-40 | 50-100 |
| Water Vapor permeability | $g/m^2 \cdot d$ | 1.6 | 4.3 | ≤0.1 |

Through the above comparison, it can be concluded that the present invention is clearly better than other similar products in various parameters.

The invention claimed is:

1. A back sheet for attachment to a solar module comprising
    a substrate,
    a layer of fluorine-based film defining a top surface and a bottom surface, one of which faces toward the substrate, and
    fluoro-silicone material associated with the fluorine-based film and appearing at the top and bottom surfaces of the film, wherein the layer of fluorine-based film is tetrafluoroethylene homopolymer, a ternary copolymer, or chlorotrifluoroethylene, and wherein said ternary copolymer includes $C_2F_4$, $C_3F_6$, and PVDF, such that when the back sheet is attached to said solar module the fluoro-silicone material is in direct contact with said solar module.

2. The back sheet as defined in claim 1, wherein said substrate is a substrate of PET, a substrate of a PET alloy, or a substrate of a PET composite.

3. The back sheet as defined in claim 2, wherein said PET alloy is melt blended PET and PBT or melt blended PET and PEN with PBT or PEN of said PET alloy being 1-50 parts by mass.

4. The back sheet as defined in claim 2, wherein said PET composite includes an inorganic oxide selected from $SiO_2$, $TiO_2$, $Al_2O_3$ or $ZrO_2$, with said PET composite being 1-35 parts by mass of said inorganic oxide.

5. The back sheet as defined in claim 1, wherein said substrate is (a) fine closed-module foam layer or (b) closed-module foamed PET having a fine closed-module foam layer with foam holes having closed and ultra fine structures.

6. The back sheet as defined in claim 1, wherein a thickness of said substrate is 0.1 to 10 mm.

7. The back sheet as defined in claim 1, wherein a content of fluororesin in said layer of fluorine-based film is 30-95 parts by mass.

8. The back sheet as defined in claim 1, the back sheet consisting essentially of: the first-mentioned layer of fluorine-based film, the first-mentioned fluoro-silicone material associated with the first-mentioned film, the substrate, a second layer of fluorine-based film defining a top surface and a bottom surface, and fluoro-silicone material being associated with the second film and appearing at the top and bottom surfaces of the second film.

9. The back sheet as defined in claim 1, the back sheet consisting essentially of: the layer of fluorine-based film, the fluoro-silicone material appearing at the top and bottom surfaces of the film, and the substrate.

10. The back sheet as defined in claim 1, the back sheet consisting essentially of: the layer of fluorine-based film, the fluoro-silicone material, and the substrate, the substrate defining a top surface and a bottom surface with the film on one of the top surface or bottom surface of the substrate, the fluoro-silicone material appearing at the other of the top surface or bottom surface of the substrate.

11. A back sheet for attachment to a solar module, comprising
   a substrate,
   a layer of fluorine-based film defining a top surface and a bottom surface, one of which faces toward the substrate,
   a layer of titanium-silicon film comprising a titanium-silicon material associated with the flourine-based film and appearing at the top and bottom surfaces of the film, such that when the back sheet is attached to said solar module the titanium-silicon material is in direct contact with said solar module the layer of titanium-silicon film having a thickness of 0.01 to 5 µm.

12. The back sheet as defined in claim 11, wherein said substrate is a substrate of PET, a substrate of a PET alloy, or a substrate of a PET composite.

13. The back sheet as defined in claim 12, wherein said PET alloy is melt blended PET and PBT or melt blended PET and PEN with PBT or PEN of said PET alloy being 1-50 parts by mass.

14. The back sheet as defined in claim 12, wherein said PET composite includes an inorganic oxide selected from $SiO_2$, $TiO_2$, $Al_2O_3$ or $ZrO_2$, with said PET composite being 1-35 parts by mass of said inorganic oxide.

15. The back sheet as defined in claim 11, wherein said substrate is (a) fine closed-module foam layer or (b) closed-module foamed PET having a fine closed-module foam layer with foam holes having closed and ultra fine structures.

16. The back sheet as defined in claim 11, wherein said layer of fluorine-based film is tetrafluoroethylene, a ternary copolymer or chlorotrifluoroethylene, and wherein said ternary copolymer includes $C_2F_4$, $C_3F_6$, and PVDF.

17. The back sheet as defined in claim 11, the back sheet consisting essentially of: the first-mentioned layer of fluorine-based film, the first-mentioned titanium-silicon material associated with the first-mentioned layer of fluorine-based film, the substrate, a second layer of fluorine-based film defining a top surface and a bottom surface, and titanium-silicon material being associated with the second film and appearing on the top and bottom surfaces of the second film.

18. The back sheet as defined in claim 11, the back sheet consisting essentially of: the layer of fluorine-based film, the titanium-silicon material, and the substrate, the substrate defining a top surface and a bottom surface with the film on one of the top surface or bottom surface of the substrate, and the titanium-silicon material appearing at the other of the top surface or bottom surface of the substrate.

19. The back sheet as defined in claim 11, wherein the titanium-silicon material is an organic compound.

* * * * *